United States Patent [19]
Mathews

[11] Patent Number: 5,393,694
[45] Date of Patent: Feb. 28, 1995

[54] ADVANCED PROCESS FOR RECESSED POLY BUFFERED LOCOS

[75] Inventor: Viju K. Mathews, Boise, Id.

[73] Assignee: Micron Semiconductor, Inc., Boise, Id.

[21] Appl. No.: 259,825

[22] Filed: Jun. 15, 1994

[51] Int. Cl.$^6$ .......................................... H01L 21/76
[52] U.S. Cl. ..................................................... 437/72
[58] Field of Search ................. 437/72; 148/DIG. 85, 148/DIG. 86, DIG. 117

[56] References Cited

U.S. PATENT DOCUMENTS

4,541,167  9/1985  Havemann ............................. 576/29

FOREIGN PATENT DOCUMENTS

0120614  10/1984  European Pat. Off. .
2101399   1/1983  Japan .
60-145638 8/1985  Japan .
4150030   5/1992  Japan .

OTHER PUBLICATIONS

Toshiyuki Nishihara et al., "A 0.5um Isolation Technology Using Advanced Poly Silicon Pad LOCOS (APPL)", IEEE, 1988, pp. 100–103.
H. S. Yang et al., "Poly void Formation in Poly Buffer LOCOS Process", Extended Abstracts of the Spring Elecrochemical Society meeting, 1992, p. 442.
J. M. Sung, "The Impact of Poly-Removal Techniques on Thin Thermal Oxide Property in Poly-Buffer LOCOS Technology", IEEE Transactions on Electron Devices, Aug. 1991, pp. 1970–1973.
Stanley Wolf, "A Review of IC Isolation Technologies—Part 6", Solid State Technology, Dec. 1992, pp. 39–41.
R. L. Guldi, "Characterization of Poly-Buffered LOCOS in Manufacturing Environment", J. Electrochem. Soc., Dec. 1989, pp. 3815–3820.
Tin-hwang Lin, "Twin-White-Ribbon Effect and Pit Formation Mechanism in PBLOCOS", J. Electrochem. Soc., Jul. 1991, pp. 2145–2149.
M. Ghezzo, "LOPOS: Advanced Device Isolation for a 0.8um CMOS/BULK Process Technology", Journal of The Electrochemical Society, Jul. 1989, pp. 1992–1996.
N. Shimizu et al., "A Poly-Buffer Recessed LOCOS Process for 256Mbit DRAM Cells", IEEE, IEDM 92-279, 1992, pp. 10.6.1–10.6.4.

Primary Examiner—George Fourson
Attorney, Agent, or Firm—Lia M. Pappas

[57] ABSTRACT

A process useful for isolating active areas of semiconductor devices, comprising the steps of: forming pad oxide, polysilicon, and nitride layers superjacent a substrate; patterning and etching the layers and the substrate, thereby forming a recess in the substrate; forming a nitride spacer within the recess, then growing a field oxide region therein; removing the layers thereby causing an indentation to form within the periphery of the field oxide region; disposing polysilicon within the indentation; etching the polysilicon to a level even with the field oxide region; and oxidizing the polysilicon.

20 Claims, 3 Drawing Sheets

ADVANCED PROCESS FOR RECESSED POLY BUFFERED LOCOS

FIELD OF THE INVENTION

This invention relates to semiconductor manufacturing, and more particularly to methods of isolating active areas on a semiconductor substrate.

BACKGROUND OF THE INVENTION

As device dimensions get smaller, and device density increases, it becomes more and more difficult to build an efficient and reliable isolation process to separate active devices. The limits of the standard LOCOS (LOCal Oxidation of Silicon) process have motivated the search for and the development of new isolation schemes.

One such scheme is Poly Buffered LOCOS (PBL), which employs a thin polysilicon layer between the oxide and nitride films in the LOCOS stack.

PBL facilitates design rule shrinking and smaller cell size required for submicron and sub-half-micron device fabrication. This isolation scheme utilizes an oxide/poly/nitride sandwich to block oxidation of the active regions during field oxidation growth. The presence of the intermediate poly layer allows the oxide to be thinned and nitride thickened without generating undue stress in the active regions in order to reduce encroachment during the field oxidation step.

One PBL method is referred to as ONO PBL because an oxide/nitride/oxide sandwich is used between the substrate and the polysilicon layer. See for example, U.S. application Ser. No. 08/017,100, entitled, "An Etch Stop Useful in Avoiding Substrate Pitting with Poly Buffered LOCOS," also assigned to Micron now U.S. Pat. No. 5,358,892.

Another isolation scheme is known as recessed Poly Buffered LOCOS. See for example, Shimizu, et al. "A PolyBuffer Recessed LOCOS Process for 256 Mbit DRAM Cells."

Applicant has observed that the conventional, non-recessed, LOCOS type process will not go much below 0.9 $\mu$m active area-field pitch. This is the pitch which is suitable for the 64M DRAM suitable for the 16M DRAM generation.

However, Applicant's preliminary tests have shown that the recessed ONO Poly Buffered LOCOS (PBL) process satisfy the physical encroachment requirements for the 0.6 $\mu$m active area-field pitch needed in the 256M DRAM generation.

Generally, recessed PBL processes lead to two main problems. The first one is the formation of a sharp corner at the active area field edge which leads to a higher leakage under positive bias on the gate. The second problem is the formation of a groove or indentation in the shape of a ring around the active areas. This groove can later lead to the generation of a stringer around the active area after etching, thereby causing a short.

The current alternative to the recessed ONO PBL process is the shallow trench isolation process. However, it significantly adds to the complexity of the manufacturing process.

SUMMARY OF THE INVENTION

The process of the present invention offers solutions to the above-stated problems relating to recessed PBL. One embodiment of the present invention provides a method for forming an isolation device in which several layers on the are formed on the surface of a semiconductor substrate. The layers and the substrate are then patterned and etched to a level below the surface of the substrate, after which a field oxide region is grown on the exposed surface of the substrate. The layers are then removed, resulting in an indentation within the field oxide region. The indentation is thereafter substantially eliminated.

In another embodiment of the process of the present invention, a recessed ONO PBL process is performed in which a 500Å recessed structure is etched into the substrate. A thin nitride (250Å–500Å) spacer is added to the recess to protect the exposed silicon sidewalls of the during the field oxidation process. Once the field oxidation masking stack is removed, but prior to the stripping of the pad oxide, a thin polysilicon film is then deposited.

This is followed by a dry etch back to remove the polysilicon on the field oxide region and active areas, and to slightly recess the polysilicon in the grooves. This will leave a ring of polysilicon in the grooves. An oxidation is done at this step to consume the polysilicon.

The oxidation will result in the formation of a small hump on the groove and the subsequent etches will smooth the profile to a more planar configuration.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 1:
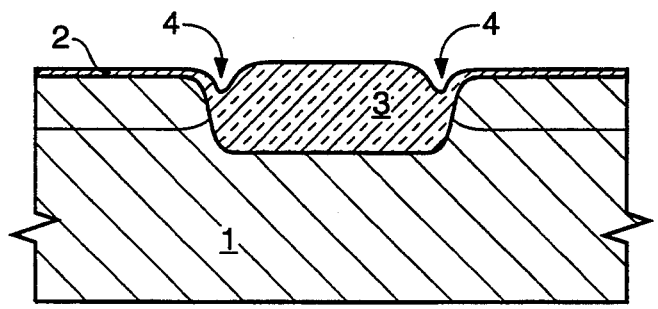
FIG. 1 is a schematic cross-section of an isolation area after the PBL stack has been removed, according to the process of the present invention.

The process of the present invention is discussed with reference to the ONO PBL process. However, one having ordinary skill in the art, upon being apprised of the process of the present invention, would be able to adapt it to other LOCOS isolation schemes without undue experimentation.

In the ONO PBL process, a semiconductor substrate 1, preferably bare silicon (Si) is oxidized at approximately 800° C. to produce a pad oxide 2. The preferred embodiment has a pad oxide 2 thickness greater than 100Å, preferably 120Å. The oxide layer 2 can be deposited or thermally grown. Stress-relief is one purpose served by the pad oxide layer 2. Alternatively, one may choose to employ an oxide layer having a thickness less than 100Å, for example in the approximate range of 80Å.

An "etch-stop" layer, preferably a nitride, is then deposited, preferably by low pressure chemical vapor deposition (LPCVD), at approximately 800° C. to create a layer having a preferred thickness of approximately 100Å.

The nitride layer displays a relative imperviousness to the chemicals and etchants used in the removal of the polysilicon layer and the thick nitride layer from the PBL stack.

Nitride is the preferred material, however, other suitable materials, including but not limited to tantalum pentoxide, indium tin oxide, and high temperature metals, may also be used.

In an alternative embodiment, the impervious layer may be disposed directly on the substrate 1, without the oxide layer 2 therebetween. However, an underlying oxide layer 2 is preferred as it affords some protection to the substrate 1.

In the preferred embodiment, another oxidation step is then performed, preferably in a steam ambient to result in a re-ox layer having a preferred thickness in the approximate range of 10–30Å. This re-ox layer can also be deposited by any of the methods currently known in the art.

At this point, a preferably undoped buffer polysilicon layer is deposited, preferably by LPCVD, to a preferred thickness of approximately 500Å. It is also possible to use doped polysilicon.

Alternatively, the polysilicon layer can be directly deposited on the thin nitride layer, without the oxide layer disposed therebetween.

The polysilicon functions as a stress-relief layer, hence the term, "buffer." Polysilicon is currently the preferred buffer material, but any material which allows the pad oxide 2 to be thin and the superjacent nitride to be thickened, without generating undue stress in the active regions may be used.

A layer of material which inhibits oxidation of the buffer layer, e.g. the polysilicon layer, is deposited. Preferably, layer is a nitride layer which is deposited by LPCVD, for a preferred thickness in the approximate range of 2400Å. Layer serves as an oxidation mask for the creation of field oxide 3.

The nitride stack is then patterned with photoresist using conventional lithography techniques or other suitable method known in the art. In the preferred embodiment, an etch step is then performed in which the unpatterned areas are etched back to the pad oxide layer 2. Alternatively, the pad oxide layer 2 may be partially etched or completely removed.

The etch is preferably an anisotropic etch which results in side walls which are substantially normal to the substrate surface 1. Preferably the etch is performed using a $Cl_2$-based chemistry in a reactive ion etcher (R.I.E.). However, other etch chemistries, such as $CHF_3$, may also be used.

The etch removes all the unpatterned layers down to the substrate 1. A portion of the substrate 1 is then etched using a silicon etch chemistry, such as, for example, HBr or $NF_3$, thereby creating a recess in the substrate 1. The substrate 1 is recessed about 200Å to 2000Å.

The photoresist layer is then removed using methods well known in the art, for example a heated mixture of sulfuric acid ($H_2SO_4$) and hydrogen peroxide ($H_2O_2$).

A thin nitride layer is then deposited, and a spacer is formed therefrom. The nitride film is preferably conformally deposited to a thickness in the approximate range of 80Å–120Å. An anisotropic etch is then performed, preferably in a plasma environment, thereby resulting in nitride spacer structures on the sides of the recess in the substrate 1.

An implant may be done at this point to increase dopant concentration in field region, if desired.

Subsequent to the etch, an oxide layer 3 (also known as, field oxide) is formed over the exposed portion of the substrate 1, for example, by oxidizing the exposed substrate 1. An oxide layer having a thickness of about 100Å to 300Å is sufficient, although other thicknesses my also function adequately. The nitride spacers are substantially consumed by the oxidation process.

The structure following a field oxidation step, which results in an oxide layer 3 having a preferred thickness in the approximate range of 4000Å. The oxidation is preferably carried out in a steam ambient.

After the oxidation step, it is necessary to sequentially remove any oxide which may have grown on the nitride layer, the nitride layer, any oxide which may have grown on the polysilicon layer, and the polysilicon layer. This strip can be done in a dry plasma environment or by use of sequential wet chemical etchants.

The preferred embodiment employs wet chemical etchants and will be described in detail below:

After the polysilicon is "decapped," the polysilicon is then "stripped" by disposing it in wet polysilicon etchants.

A buffered oxide etch "decaps" or substantially removes any oxidation which has occurred on top of the nitride layer. The nitride layer is then "stripped" or removed in hot phosphoric acid ($H_3PO_4$).

The next layer to be removed is the polysilicon buffer layer 5. The polysilicon is "decapped" in a hydrogen fluoride (HF) ambient. This step is undertaken to substantially remove any oxidants which may have grown on the buffer layer. After the polysilicon is "decapped," the polysilicon is then "stripped" by disposing it in wet polysilicon etchants.

The next step is a wet buffered oxide etch "decap" which removes the oxide layer. The nitride layer is then "stripped" or removed in hot phosphoric acid.

Figure 6:
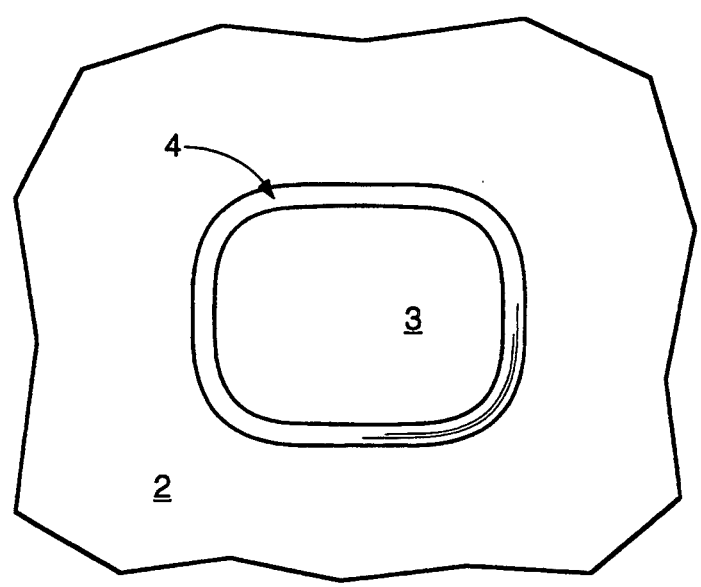
FIG. 6 is a schematic top view of the isolation area of FIG. 1.

Subsequent to the removal of the above-described layers, the corners of the recessed field oxide region displays a sharp edge, which edge appears as a groove or indentation 4 along the inner perimeter of the field oxide region 3, as viewed from above. See, for example FIGS. 1 and 6. The edge increases the likelihood of charge leakage across the active areas, and the consequent shorting out of the semiconductor part.

Figure 2:
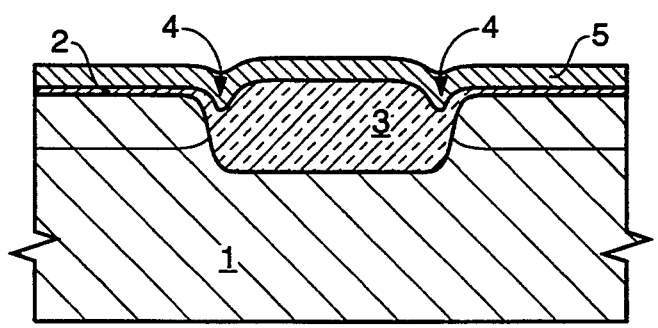
FIG. 2 is a schematic cross-section of the isolation area of FIG. 1, after the deposition of a polysilicon layer in the grooves, according to the process of the present invention.

The process of the present invention provides for eliminating the indentation or groove 4 through the use of deposited polysilicon film 5. The polysilicon 5 is conformally deposited over the surface of the wafer 1, thereby filling in the groove 4, as illustrated in FIG. 2.

Figure 3:
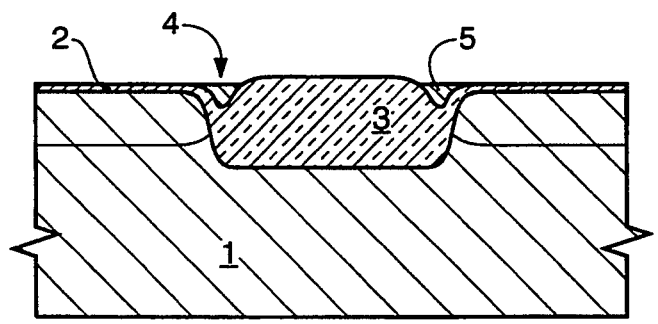
FIG. 3 is a schematic cross-section of the isolation area of FIG. 2, after the polysilicon layer has been etched back, according to the process of the present invention.

The polysilicon layer 5 is then etched back, preferably using a dry etch method. After the etch back, the polysilicon layer 5 remains essentially only in the grooves 4, as illustrated in FIG. 3.

Alternatively, chemical planarization is used to planarize the deposited polysilicon 5. This approach is less desirable, however, as it is difficult to determine when to stop the planarization process.

Figure 4:
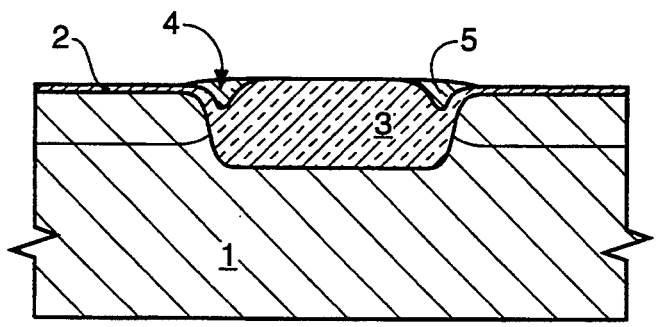
FIG. 4 is a schematic cross-section of the isolation area of FIG. 3, after the polysilicon layer has been oxidized, according to the process of the present invention.

The deposited polysilicon 5 is then oxidized, preferably in a steam ambient. The groove or moat 4 is thereby filled-in, and made level with the rest of the field oxide area 3, as illustrated in FIG. 4.

Figure 5:
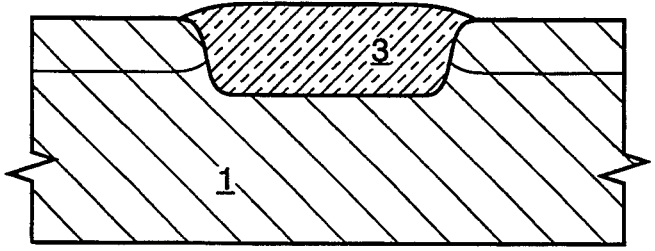
FIG. 5 is a schematic cross-section of the isolation area of FIG. 4, after the pad oxide has been stripped according to the process of the present invention.

The pad oxide 2 can then be removed, in HF for about 45 seconds. FIG. 5 illustrates the isolated active area after the various layers have been removed. Alternatively, the pad oxide layer 2 may be left on the substrate 1.

All of the U.S. patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, the process was illustrated with reference to an ONO Poly Buffered LOCOS process. One having ordinary skill in the art, after being apprised of the invention, will realize that the invention is adaptable for use in other LOCOS processes, as well.

What is claimed is:

1. A method for forming an isolation device comprising the following steps of:
    providing a semiconductor substrate having a surface;
    forming a plurality of layers on the surface of said semiconductor substrate;
    patterning and etching said layers, thereby exposing a portion of said substrate surface;
    etching said exposed portion of said substrate to a level below said surface of said substrate;
    growing a field oxide region on said etched portion of said substrate;
    removing said layers, thereby forming an indentation within said field oxide region; and
    substantially eliminating said indentation, wherein said indentation is eliminated by:
    filling said indentation with a conformal film;
    planarizing said conformal film; and
    oxidizing said conformal film.

2. The method according to claim 1, wherein said conformal film comprises polysilicon.

3. The method according to claim 2, wherein said planarizing comprises etching.

4. The method according to claim 3, wherein said substrate is etched 500Å below said surface.

5. The method according to claim 1, further comprising the steps of:
    depositing a nitride film on said etched portion of said substrate surface; and
    anisotropically etching said nitride film, thereby forming a nitride spacer.

6. The method according to claim 5, wherein said nitride spacer is in the approximate range of 250Å–500Å.

7. A process useful for isolating active areas of semiconductor devices, comprising the following steps of:
    forming at least a pad oxide layer, a polysilicon layer, and a nitride layer superjacent a substrate;
    patterning and etching said layers and said substrate, thereby forming a recess in said substrate;
    forming a nitride spacer within said recess;
    growing field oxide region in said recess, said field oxide region having a periphery;
    removing said layers, said removal causing an indentation to form within said periphery of said field oxide region;
    disposing polysilicon within said indentation;
    etching said polysilicon to a level essentially planar with said field oxide region; and
    oxidizing said polysilicon.

8. The process according to claim 7, further comprising the step of:
    removing said pad oxide layer.

9. The process according to claim 8, wherein said nitride spacer is formed by:
    depositing a nitride film; and
    anisotropically etching said nitride film.

10. The process according to claim 9, wherein said anisotropic etch is performed in a plasma environment.

11. The process according to claim 10, wherein said nitride film is conformally deposited.

12. The process according to claim 11, wherein said nitride spacer is in the approximate range of 250Å–500Å.

13. The process according to claim 12, wherein said semiconductor devices have an active area-field pitch below 0.9 μm.

14. A process for fabricating a recessed field oxide area, comprising the following steps of:
    disposing successive layers of pad oxide/nitride/oxide/polysilicon/nitride on a substrate;
    anisotropically etching said layers and said substrate, thereby forming a recess in said substrate;
    oxidizing the resulting exposed portion of said substrate, thereby forming a field oxide region;
    removing said nitride/oxide/polysilicon/nitride layers, thereby causing irregularities in said field oxide region;
    depositing a polysilicon film superjacent said substrate;
    dry etching said polysilicon film;
    oxidizing said polysilicon film; and
    stripping said pad oxide layer.

15. The process according to claim 14, wherein said deposited polysilicon film fills in any irregularities in said field oxide region.

16. The process according to claim 15, wherein said substrate is etched 500Å to form said recess.

17. The process according to claim 15, wherein said irregularities comprise at least one of corners and indentations.

18. The process according to claim 14, wherein a nitride spacer is formed in said recess of said substrate.

19. The process according to claim 18, wherein said nitride spacer is consumed during said substrate oxidation.

20. The process according to claim 18, wherein said nitride spacer is in the approximate range of 250Å–500Å.

* * * * *

UNITED STATES PATENT AND TRADEMARK OFFICE
CERTIFICATE OF CORRECTION

Patent No.: 5,393,694

Dated: February 28, 1995

Inventor(s): Viju K. Mathews

It is certified that error appears in the above-mentioned patent and that said Letters Patent is hereby corrected as shown below:

Column 1, line 4, please insert:

-- This invention was made with Government support under Contract No. MDA972-92-C-0054 awarded by Advanced Research Projects Agency (ARPA). The Government has certain rights in this invention. --

Signed and Sealed this

Ninth Day of May, 1995

Attest:

BRUCE LEHMAN

Attesting Officer

Commissioner of Patents and Trademarks